United States Patent [19]

Morimoto et al.

[11] Patent Number: 5,084,436
[45] Date of Patent: Jan. 28, 1992

[54] ORIENTED SUPERCONDUCTOR CONTAINING A DISPERSED NON-SUPERCONDUCTING PHASE

[75] Inventors: Takeshi Morimoto; Toshiya Matsubara; Jun-ichiro Kase; Jun-ichi Shimoyama, all of Yokohama, Japan

[73] Assignee: Asahi Glass Company Ltd., Tokyo, Japan

[21] Appl. No.: 471,650

[22] Filed: Jan. 29, 1990

[30] Foreign Application Priority Data

Jan. 31, 1989 [JP] Japan .................................. 1-19818
Mar. 30, 1989 [JP] Japan .................................. 1-76769
Jul. 31, 1989 [JP] Japan .................................. 1-196769

[51] Int. Cl.$^5$ .................... C01F 11/02; C01F 17/00; C01G 3/02; H01L 39/00
[52] U.S. Cl. .................................. 505/1; 252/521; 423/604; 423/635; 501/123; 501/152; 505/785
[58] Field of Search .................... 505/1, 785; 252/521; 423/604, 635; 501/123, 152

[56] References Cited

U.S. PATENT DOCUMENTS

| | | | |
|---|---|---|---|
| 4,824,826 | 4/1984 | Damento et al. | 252/521 |
| 4,916,114 | 4/1990 | Hoenig | 505/1 |
| 4,942,151 | 7/1990 | Capone et al. | 505/1 |
| 4,956,336 | 9/1990 | Salama et al. | 505/1 |
| 4,973,575 | 11/1990 | Capone | 505/1 |
| 4,975,411 | 12/1990 | Danby et al. | 505/1 |
| 4,990,493 | 2/1991 | Lay | 565/1 |

OTHER PUBLICATIONS

Jin, "High Critical Currents in Y-Ba-Cu-O Superconductore", Appl Phys. Lett. v. 52(24), Jun. 13, 1988, pp. 2074-2076.

Liu, "Superconductivity and Structure of Single X'tal Y Ba$_2$Cu$_3$O$_x$", Physic Lett. A, v. 121(6), May 4, 1987, pp. 305-306.

Hidaka, "Anisotrophy of the Upper Critical Magnetic Field . . . ", Jap. Jnl. Appl. Phys., v. 26(5), May 1987, pp. L726-728.

Ekin, "Transport Critical Current in Bulk Sintered BYa$_2$Cu$_3$O$_x$", Adv. Ceramic Mat'ls, v. 2. (3B) Special Issue, Jul. '87, p. 586.

Murphy, "New Superconducting Cuprate Perouskiter", Phys. Rev. Lett., v. 58(18), May 4, 1987, pp. 1888-1890.

High Tc Update, v. 3(8) DOE, Apr. 15, 1989.

Primary Examiner—Paul Lieberman
Assistant Examiner—John Boyd
Attorney, Agent, or Firm—Oblon, Spivak, McClelland, Maier & Neustadt

[57] ABSTRACT

An oxide superconductor comprising a matrix of plate crystals of the formula REBa$_2$Cu$_3$O$_{7-y}$ wherein RE is at least one member selected from the group consisting of Y, La, Nd, Sm, Eu, Gd, Dy, Ho, Er, Tm, Yb, and Lu, and y is the amount of oxygen deficiency, oriented and overlaid one on another, and granular crystals of the formula RE$_2$BACuO$_5$ wherein RE is as defined above, insularly dispersed in the matrix in an amount of at least 0.1 mol per mol of the REBa$_2$Cu$_3$O$_{7-y}$ crystals.

4 Claims, 2 Drawing Sheets $REBa_2Cu_3O_{7-y}$ $RE_2BaCuO_5$

ORIENTED SUPERCONDUCTOR CONTAINING A DISPERSED NON-SUPERCONDUCTING PHASE

BACKGROUND OF THE INVENTION

1. Field of the Invention

The present invention relates to oxide superconductors containing rare earth elements having a novel structure and a process for their production.

2. Discussion of Background

Heretofore, superconductors (hereinafter referred to as rare earth superconductors) of the formula $REBa_2Cu_3O_{7-y}$ wherein RE is at least one member selected from the group consisting of Y, La, Nd, Sm, Eu, Gd, Dy, Ho, Er, Tm, Yb and Lu and y is the amount of oxygen deficiency, have been known. As a method for producing a bulk material of a rare earth superconductor, there is a method wherein a crystal powder having the above composition is prepared, and then the powder is compacted and sintered. It is also known to prepare it by a solgel method or by a melt process.

The superconductors prepared by such methods are all polycrystals, wherein crystals are randomly oriented, and at the grain boundaries, they contain crystal phases other than $REBa_2Cu_3O_{7-y}$ crystal superconducting phase (hereinafter referred to as a 123 phase), and/or non-crystaline phases, and in many cases they contain air bubbles. A rare earth superconductor has a predetermined direction in the crystals of the 123 phase in which an electric current readily flows. Therefore, the current tends to hardly flow among crystals aligned in different directions. Further, the grain boundary is not a superconductor, and it acts as an insulating layer. Therefore, none of conventional polycrystal rare earth superconductors exhibits a high critical current density.

The degradation in the critical current density attributable to such a grain boundary is known to be a phenomenon observed particularly remarkably in a magnetic field. With respect to the application field of superconductors, they are considered useful primarily as magnets capable of providing strong magnetic fields in the form of wire material or tape material formed in to a coil. Therefore, in order to make a rare earth superconductor to be practically useful, it is believed necessary to prepare a structure wherein crystals of the 123 phase are aligned and the grain boundary is suppressed to obtain a material having a high critical current density even in a strong magnetic field.

As a common method for preparing a ceramic material having such a structure, a method is known wherein a melt is solidified in one direction under a temperature gradient. By this method, it is possible to obtain an aligned ceramic material having a density higher than the one obtainable by a sintering method. However, the 123 phase melts incongruently at a temperature of about 1,000° C. to form $RE_2BaCuO_5$ crystals (hereinafter referred to as a 211 phase) and a liquid phase rich in CuO or $BaCuO_2$. Accordingly, when the melt having the same composition as the 123 phase is cooled, the 211 phase precipitates first, whereby it is impossible to obtain by a usual method to obtain a single crystal or an aligned polycrystal of the 123 phase.

Under these circumstances, a self flux method has been proposed. As shown in FIG. 4, according to this method, when compound AB is subjected to incongruent melting to form a solid phase A and a liquid phase rich in B, the entire composition is shifted towards B (composition Y) so that crystals of AB are grown from the liquid phase rich in B. Accordingly, the solidified product finally obtained will be a mixture of AB and B. Yet, it has a structure wherein B is present at the grain boundary of crystal grains of AB, and AB will not constitute a continuous phase.

In the case of a rare earth superconductor, the 123 phase corresponds to AB in FIG. 4, and likewise, the 211 phase corresponds to A and the liquid phase rich in CuO or $BaCuO_2$ corresponds to the liquid phase rich in B. It has been reported that in a case where RE is yttrium, the composition with an atomic ratio of Y:Ba:Cu=1:2:3 is shifted to a direction rich in Cu, or rich in Cu and Ba, so that a liquid phase will be formed at a temperature lower than the incongruent melting temperature of $YBa_2Cu_3O_{7-y}$, and then $YBa_2Cu_3O_{7-y}$ crystals are grown from the liquid phase of Y-Ba-Cu-O system (e.g. Japanese Journal of Applied Physics, Vol. 26, L1425, (1987)).

According to this method, a thin plate single crystal of about 1×1 mm or a block polycrystal having a long axis of about 3 mm containing impurities, is obtainable. However, it is difficult to obtain a larger crystal. Besides, the structure tends to be such that the $YBa_2Cu_3O_{7-y}$ crystal grains are surrounded by CuO or $BaCuO_2$ as an insulator, and it is difficult to obtain a superconductive structure wherein crystals are continuous. In the case of $YBa_2Cu_3O_{7-y}$, it is particularly difficult to obtain a uniform product having a practical size, since the primary crystal region is narrow, and the melt is likely to undergo phase separation.

In addition to the self flux method, a MTG (Melt-textured growth) method is also reported wherein $YBa_2Cu_3O_{7-y}$ crystals are heated and melted to obtain a mixture wherein a solid phase of $Y_2BaCuO_5$ and a liquid phase of Y-Ba-Cu-O system coexist, which is then solidified under a temperature gradient to let $YBa_2Cu_3O_{7-y}$ crystals grow by a peritectic reaction represented by the formula:

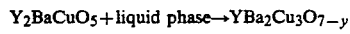
$Y_2BaCuO_5 + \text{liquid phase} \rightarrow YBa_2Cu_3O_{7-y}$ (Physical Review B, Vol. 37, 7850, (1988)).

However, the product was the one which contains in addition to $YBa_2Cu_3O_{7-y}$ crystals, $Y_2BaCuO_5$ crystals and other grain boundary phases (CuO, $BaCuO_2$, non-crystalline phase). Because the liquid phase of Ba-Cu-O system solidifies at lower temperature than 123 phase, it spreads as an insulating layer along the grain boundaries of the $YBa_2Cu_3O_{7-y}$ crystals. Such an insulating layer adversely affects the electrical conductivity characteristics. Further, although the $YBa_2Cu_3O_{7-y}$ phase has certain orientation, the crystals are in contact with each other with certain angles.

A QMG (Quench and Melt Growth) method (1988 Autumn 49th Lecture Meeting of the Japan Society of Applied Physics, 4a-pavilion B-2) is a method wherein a sample melted and then quenched, is again partially melted, followed by solidification. By the first melting and quenching, a structure is formed wherein $Y_2O_3$ is dispersed in the form of fine particles, and it is again melted and solidified to let the following two step peritectic reaction take place:

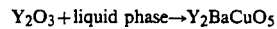
$Y_2O_3 + \text{liquid phase} \rightarrow Y_2BaCuO_5$

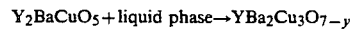
$Y_2BaCuO_5 + \text{liquid phase} \rightarrow YBa_2Cu_3O_{7-y}$

In this reaction, $Y_2O_3$ first dispersed is fine particles, and the finally obtained structure will be such that $Y_2BaCuO_5$ is finally dispersed in the $YBa_2Cu_3O_{7-y}$ matrix, whereby the uniformity of the entire solidified product will be improved. However, a quenching operation is required. Accordingly, there is a limitation in the shape of the product thereby obtained.

SUMMARY OF THE INVENTION

It is an object of the present invention to obtain a rare earth superconductor having a high critical current density and whereby a decrease in the critical current density is small even when a magnetic field is applied.

The present invention provides an oxide superconductor comprising a matrix of plate crystals of the formula $REBa_2Cu_3O_{7-y}$ wherein RE is at least one member selected from the group consisting of Y, La, Nd, Sm, Eu, Gd, Dy, Ho, Er, Tm, Yb and Lu, and y is the amount of oxygen deficiency, oriented and overlaid one on another, and granular crystals of the formula $RE_2BaCuO_5$ wherein RE is as defined above, insularly dispersed in the matrix in an amount of at least 0.1 mol per mol of the $REBa_2Cu_3O_{7-y}$ crystals.

The present invention also provides a process for producing an oxide superconductor comprising a matrix of plate crystals of the formula $REBa_2Cu_3O_{7-y}$ wherein RE is at least one member selected from the group consisting of Y, La, Nd, Sm, Eu, Gd, Dy, Ho, Er, Tm, Yb and Lu, and y is the amount of oxygen deficiency, oriented and overlaid one on another, and granular crystals of the formula $RE_2BaCuO_5$ wherein RE is as defined above, insularly dispersed in the matrix in an amount of at least 0.1 mol per mol of the $REBa_2Cu_3O_{7-y}$ crystals, which comprises cooling and crystallizing from a partially melted state under a temperature gradient wherein a solid phase of $RE_2BaCuO_5$ and a liquid phase of RE-Ba-Cu-O system coexist.

BRIEF DESCRIPTION OF THE DRAWINGS

In FIG. 2, the ordinate represents the temperature, and the abscissa indicates the position in the furnace by the distance from the portion showing the maximum temperature. In the abscissa, + means an upper direction from the maximum temperature portion, and − means a lower direction from the maximum temperature portion.

DETAILED DESCRIPTION OF THE PREFERRED EMBODIMENTS

Figure 1:
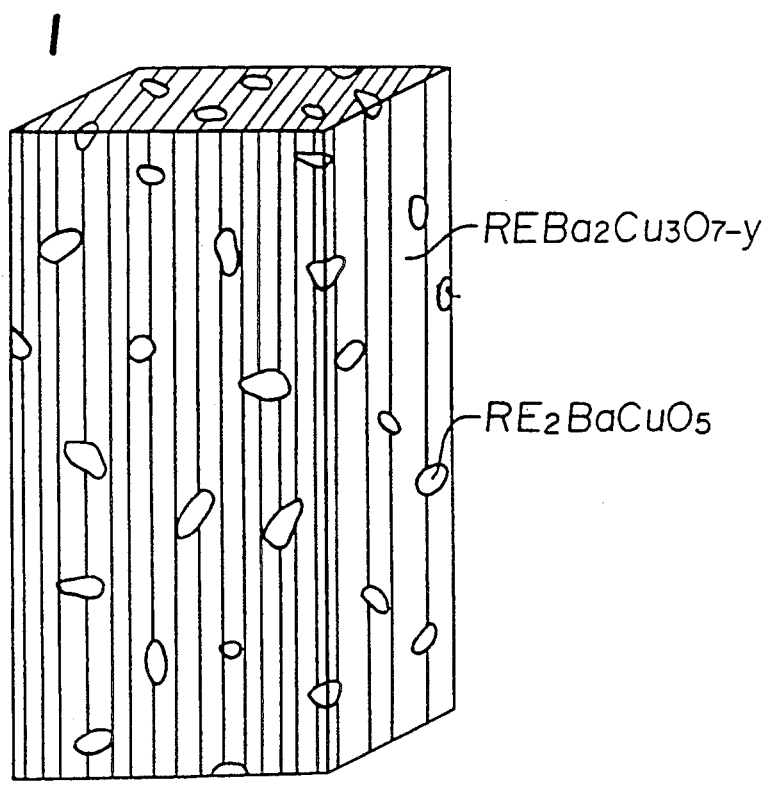
FIG. 1 is a diagrammatic view illustrating the structure of a superconductor of the present invention.

As shown diagrammatically in FIG. 1, the superconductor of the present invention has a structure in which the 123 phase constitutes a matrix. This 123 phase is crystals grown in a plate shape in a direction perpendicular to c-axis and constitutes a polycrystal as a whole. These plate crystals are aligned and overlaid one on another in a layered structure with respect to the respective c-axes aligned in the same direction. Also the crystals are not necessarily completely continuous in a single crystal fashion in the direction perpendicular to the c-axis, the planes of the c-axis are oriented in the same direction, and the superconductive state is scarcely broken even when a magnetic field is applied. Further, in the superconductor of the present invention, the granular 211 phase is insularly dispersed in the above mentioned 123 phase. The 211 phase is contained in an amount of at least 0.1 mol per mol of the $REBa_2Cu_3O_{7-y}$ crystals. The 211 phase is not oriented, and the crystals in the phase are not continuous. Although the 211 phase shows no superconductivity, the crystal particles do not hinder the flow of electric current and give no substantial adverse effects to the superconducting properties so long as they are independent from one another in such a manner.

The superconductor of the present invention contains no substantial crystal phases other than 123 and 211 phases or no substantial non-crystalline phases. However, phases other than 123 and 211 phases may partially be contained, so long as the amounts are limited so as not to degrade the superconducting properties.

For the preparation of the rare earth superconductor of the present invention, the following process is preferably employed.

As mentioned above, the 123 phase melts incongruently at a temperature of about 1,000° C. If the melting point is adjusted at a level higher than the incongruent melting temperature and lower than the liquid phase temperature, there will be a partially melted state wherein a solid phase of the 211 phase and a liquid phase of RE-Ba-Cu-O system coexist. A superconductor having the structure of the present invention is obtainable by solidifying and crystallizing the mixture in such a partially melted state in one direction under a temperature gradient.

At that time, crystallization proceeds as follows. In the partially melted state, a non-oriented 211 phase and a melt of RE-Ba-Cu-O system coexist. If the mixture is cooled under a temperature gradient from such a state, the 123 phase precipitate from the 211 phase and the melt at the incongruent melting temperature. When the 123 phase is subjected to crystal growth under a temperature ingredient, it will have a structure wherein the c-axes of the crystals are perpendicular to the temperature gradient, and plate crystals with the respective c-axes being parallel to one another, will be overlaid one on another in a layered state.

In such a partially melted state, if the overall average composition of the melt and the solid phase is inclined or shifted towards the 211 phase composition from the 123 phase composition, the 211 phase will not completely be changed to the 123 phase by the peritectic reaction, and a part thereof will remain unreacted in the layered structure of the 123 phase, whereby there will be a structure in which granular crystals are insularly dispersed.

Figure 3:
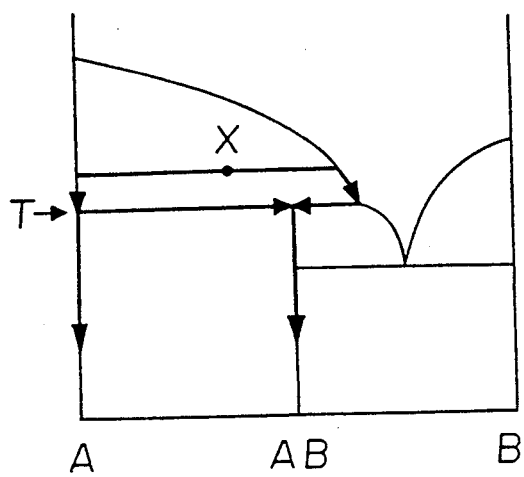
FIG. 3 is a view illustrating the solidification process of the present invention in a phase equilibrium diagram in the case where a compound AB melts incongruently to form solid phase A and a liquid phase rich in B.
Figure 4:
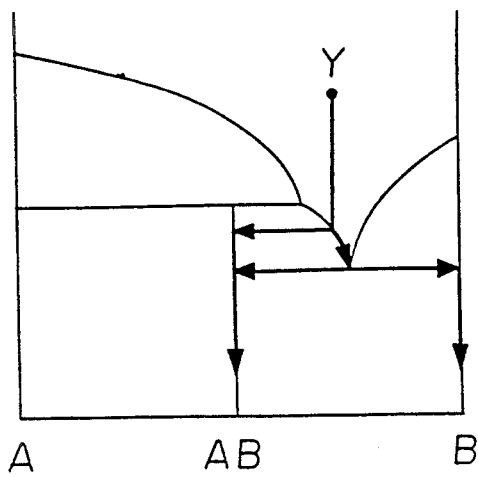
FIG. 4 is a view illustrating the solidification process according to self flux method in a phase equilibrium diagram in the case where a compound AB melts incongruently to form a solid phase A and a liquid phase rich in B.

This will be described with reference to FIG. 3 as follows. Here, as in the case of FIG. 4, the 123 phase corresponds to AB, the 211 phase corresponds to A, and the liquid phase rich in CuO or $BaCuO_2$ corresponds to the liquid phase rich in B. When a mixture comprising AB ($REBa_2Cu_3O_{7-y}$) to be incongruently melt and A ($RE_2BaCuO_5$) formed afresh during the incongruent melting of AB, is used as the starting material, solid phase A and a liquid phase rich in B will be formed during the melting as shown by X in FIG. 3, and the overall composition will be inclined or shifted towards A from AB. When this is cooled to the incongruent melting temperature (T), solid phase AB from solid phase A and the liquid phase rich in B will be formed by the peritectic reaction. Since the overall composition is inclined towards A from AB, a part of A remains unreacted in AB, whereas component B does not remain in the solidified material. A remaining in the solidified material will be granular crystals as a characteristic of the peritectic reaction and is insularly dispersed in a continuous matrix of AB.

As in the present invention, when at least 0.1 mol of the 211 phase per mol of the 123 phase remains in the solidified material, the melt will be consumed solely for the formation of the 123 phase. Therefore, crystal phases other than the 123 and 211 phases or noncrystalline phases do not appear in the solidified material. When the 123 phase was used alone as the starting material, a structure wherein granular crystals of the 211 phase are dispersed in a matrix of the 123 phase, will be obtained at a very small portion of the solidified material. However, in this case, it is unavoidable that a CuO and/or $BaCuO_2$ phase simultaneously precipitates at the grain boundaries. To prevent the precipitation of the CuO and/or $BaCuO_2$ phase, it is necessary that the 211 phase is contained in an amount of at least 0.1 mol per mol of the 123 phase in the solidified material. More preferably, the 211 phase is at least 0.2 mol per mol of the 123 phase, since the CuO and/or $BaCuO_2$ phase thereby tends to form more hardly, and the control of the solidification conditions will be easy. If the 211 phase exceeds 5 mols per mol of the 123 phase, the proportion of the crystals showing superconductivity tends to be too small, such being undesirable. More preferably, the 211 phase is at most 3 mols per mol of the 123 phase.

In the present invention, a mixture of the 123 phase and the 211 phase is preferably heated to form a partially melted state. In such a case, a partially melted state will be formed in which a solid phase is uniformly dispersed in a melt at the time of melting, whereby the resulting solidified material will also be uniform. The mixture is preferably preliminarily molded. For example, it is preferred that a powder of the above mixture is compression-molded, followed by sintering. In the partially melted state, the 211 phase is present in a solid phase, whereby the melting and solidification can be conducted while maintaining the shape of the starting material.

In the present invention, the conditions for directional solidification are preferably a temperature gradient of at least 50° C./cm and a crystallization rate of at most 20 mm/hr. More preferred conditions are a temperature gradient of at least 100° C./cm and a crystallization rate of at most 2 mm/hr.

Figure 5:
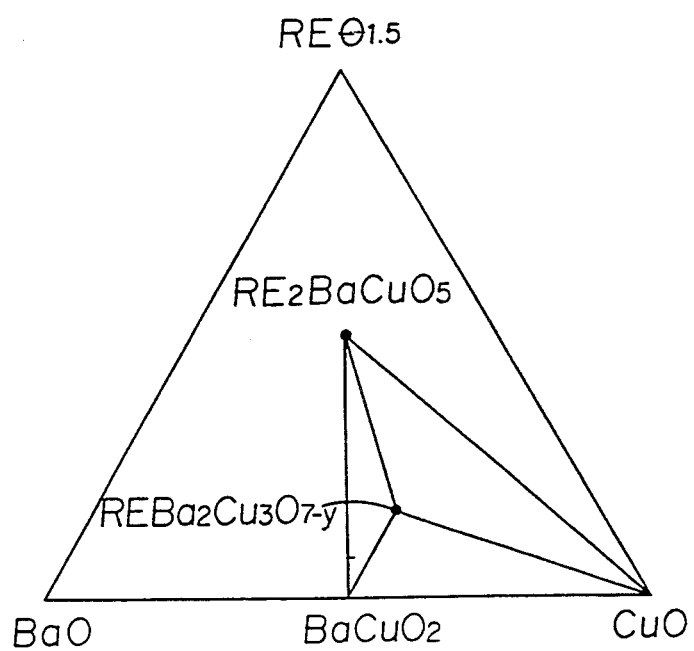
FIG. 5 is the phase diagram of $REO_{1.5}$-BaO-CuO system.

Now, a preferred range of composition will be described with reference to the phase diagram of $REO_{1.5}$-BaO-CuO system (FIG. 5). Apart from secondary factors such a vaporization of CuO during the melting operation, it is preferred that the composition of the starting material is on a linear line connecting the 123 phase and the 211 phase and agrees to the composition of the product in view of the characteristics of the peritectic reaction. However, when solidification is conducted by directional solidification, extra components tend to be excluded forwardly or sidewards from the crystal growth direction during the crystal growth of the 123 phase. Therefore, the composition on the linear line connecting the 123 phase and the 211 phase may contain other components in an amount of not more than 10% by weight. Preferably, such other components are not more than 3% by weight. However, if the entire composition is outside the triangle defined by the lines connecting $CuO-Re_2BaCuO_5-BaCuO_2$, the 123 phase crystals showing superconductivity tend to hardly form, such being undesirable. Further, if the entire composition is within a triangle defined by the lines connecting $CuO-REBa_2Cu_3O_{7-y}-BaCuO_2$, CuO and/or $BaCuO_2$ is likely to form, such being undesirable.

The proportions of the 123 phase and the 211 phase are preferably from 0.1 to 5 moles of the 211 phase per mol of the 123 phase. If the 211 phase is less than 0.1 mol per mole of the 123 phase, CuO and/or $BaCuO_2$ is likely to form, such being undesirable. If the 211 phase exceeds 5 moles per mol of the 123 phase, the proportion of the crystal phase showing superconductivity tends to be small, such being undesirable. Even when a mixture prepared by adding at least 2 moles of the 211 phase to the 123 phase, is employed, the 123 phase showing superconductivity will form a continuous matrix, whereby a solidified material having excellent superconducting characteristics can be obtained. A more preferred amount of the 211 phase is from 0.2 to 3 moles per mol of the 123 phase.

In a more preferred embodiment of the present invention, at least two rare earth elements are used as RE.

When a superconductive material is used in a strong magnetic field, fluxoids penetrating through the material are required to be fixed at pinning centers. As the pinning centers, fine precipitates of a non-superconductor, grain boundaries or defects of various types, are considered. In the case of a rare earth superconductor as shown in FIG. 1, the fine particles of the 211 phase finely dispersed, are considered to be such pinning centers.

For such fine precipitates to function as effective pinning centers, the particle size is desired to be as small as at most 1 $\mu$m. When a rare earth superconductor is prepared by directional solidification, if it is attempted to reduce the particle size of the 211 phase by controlling the solidification conditions, the orientation of the 123 phase tends to be inferior. Therefore, when only one rare earth element is is employed as RE, the particle size of the particles of the 211 phase is at least a few $\mu$m at the smallest. When two or more rare earth elements are used as RE, it is possible to reduce the particle size of the particles of the 211 phase, whereby a high pinning effect can advantageously be obtained. As a result, a high critical current density can be attained even when a magnetic field is applied. In order to obtain a high pinning effect, at least 1% by volume of the granular crystals of the 211 phase preferably have a particle size of at most 1 $\mu$m.

When at least two rare earth elements are used in the present invention, the crystal grains of the 211 phase hardly grow to be large even under directional solidification conditions under which plate crystals of the 123 phase readily grow in one direction. The reason for this tendency is not clearly understood. However, it is considered that the respective rare earth elements have different proportions as between the ones contained in the 211 phase in a molten state and the ones contained in the liquid phase, whereby it is possible that a structure having the particles of the 211 phase more finely dispersed than the case where only one rare earth element is employed is formed. Particularly when an element having a large ion radius such as Sm or Eu and an element having a relatively small ion radius such as Y are combined, Sm or Eu is preferentially taken into the 211 phase, whereby the crystal grains of the 211 phase tend to hardly grow to be large.

In order to obtain such mixing effects of rare earth elements adequately, the content of the element in the second largest amount among at least two RE, is preferably at least 1 mol % relative to the total RE. More preferably, this content is 10 mol %.

Now, the present invention will be described in further detail with reference to Examples. However, it should be understood that the present invention is by no means restricted by such specific Examples.

EXAMPLE 1

Figure 2:
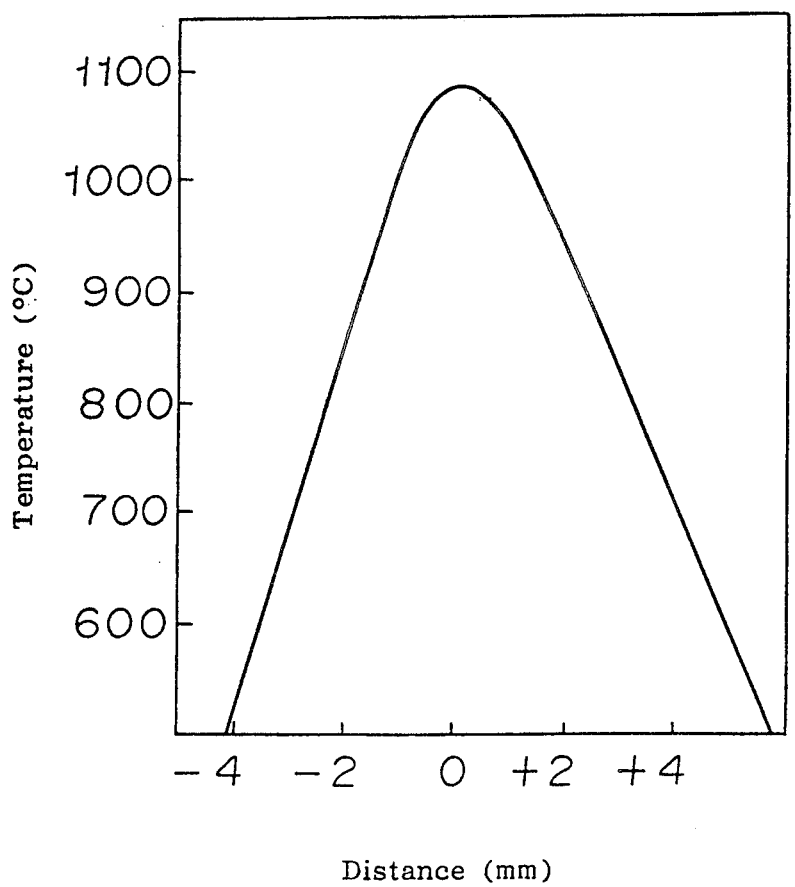
FIG. 2 is a graph showing the temperature distribution of an electric furnace used in Example 1 of the present invention.

A calcined powder of oxides was prepared so that the atomic ratio of Y:Ba:Cu was 24:1:31.5:44.4 ($YBa_2Cu_3O_{7-y}$:$Y_2BaCuO_5$=7:3) and compression-molded by a die to obtain a compact of 70 mm×40 mm×1.8 mm. The compact was sintered in an oxygen stream at 930° C. for 10 hours to obtain a sintered material of a mixture of $YBa_2Cu_3O_{7-y}$ and $Y_2BaCuO_5$. This sintered material was cut to have a width of 1.5 mm to obtain a sintered material of a square bar shape having a length of about 70 mm or less Then, an upper end of this square bar-shaped sintered material was held and hanged in a vertical tubular electrical heating furnace having a temperature distribution as shown in FIG. 2, and the sintered material was slowly moved upwardly from the lower end of the furnace while supplying oxygen gas from the lower end, for melting and solidifying. The maximum temperature in the furnace was 1,080° C., and the temperature gradient was maintained at 100° C./cm, and the moving speed of the sintered material was 1 mm/hr. In the vicinity of the maximum temperature, the sintered product was in a partially melted state. However, even in such a state, the sample underwent little substantial deformation, and no special support was required. The solidified material thereby obtained was further heated at 900° C. in an oxygen atmosphere, followed by gradual cooling at a rate of 10° C./hr to let it absorb oxygen sufficiently.

This solidified material was observed by an optical microscope, a scanning electron microscope and an X-ray microanalyzer, whereby it was confirmed that a structure wherein granular $Y_2BaCuO_5$ crystal particles were insularly dispersed and $YBa_2Cu_3O_{7-y}$ plate crystals oriented in a single crystal fashion are continuously connected to surround the dispersed granular crystal particles, was formed uniformly from the upper end to the lower end of the solidified material. Then, this solidified material was divided equally into 5 from the top to the bottom, and the magnetization curve at 77K was measured at each portion by VSM (Vibrating sample magnetometer), whereby it was confirmed that each portion exhibited substantial diamagnetization, and the magnetization hysteresis was large.

Further, a part of the solidified material was cut out to obtain a sample of 0.90 mm×0.15 mm×12 mm, and the superconducting characteristics were measured by a four-point-probe method. The critical temperature showing zero resistance was 86K, and the critical current density at 77K and in a 1 tesla magnetic field was 6,000 A/cm².

EXAMPLE 2

By using a rare earth element RE as identified in Table 1, a calcined powder of oxides was prepared so that the atomic ratio of RE:Ba:Cu became 13:17:24, and the powder was compression-molded by a mold into a compact of 70 mm×40 mm×2 mm. The compact was sintered in an oxygen stream at 930° C. for 10 hours. After cooling, the sintered material was cut to obtain a sintered material of a square bar shape of 70 mm×4 mm×2 mm.

Then, this square bar-shaped sintered material was melted and solidified in one direction in the same manner as in Example 1 except that the temperature gradient in the tubular heating furnace was changed to 50° C./cm and the moving speed of the sintered body was changed to 2 mm/hr. The resulting solidified material was again heated to 700° C. in an oxygen atmosphere, followed by gradual cooling at a rate of 15° C./hr, and then it was held at 450° C. for 40 hours to let it absorb oxygen sufficiently.

This oxide superconductor was observed by a scanning electron microscope and by an X-ray microanalyzer, whereby it was confirmed that the superconductor had the same structure as in FIG. 1 wherein plate-like 123 phase crystal grains were overlaid one on another in a layered state and granular 211 phase crystal grains were insularly dispersed therein. The crystal particle size of the 211 phase was as large as a few tens μm, and fine particles of less than 1 μm were not observed.

The solidified material was cut into a size of 1 mm×0.15 mm×10 mm, and the superconducting characteristics were measured by a four-point-probe method. The critical temperature (Tc) is a temperature where the resistance was zero. The critical current density (Jc) was measured in a state where 5 tesla of an external magnetic field was applied at a liquid nitrogen temperature (77K). The results of the measurement are shown in table 1.

TABLE 1

| RE | Tc (K) | Jc (A/cm²) |
| --- | --- | --- |
| Y  | 92 | 1200 |
| Sm | 89 | 1200 |
| Eu | 92 | 1000 |
| Gd | 92 | 700 |
| Er | 92 | 1100 |
| Yb | 90 | 900 |

EXAMPLE 3

By using two types of rare earth elements RE 1 and RE 2 as identified in Table 2, a calcined powder of oxides was prepared so that the atomic ratio of RE1:RE2:Ba:Cu became a:b:17:24. The powder was compression-molded by a mold into a compact of 70 mm×40 mm×2 mm. The compact was sintered in an oxygen stream at 930° C. for 10 hours, then cooled and cut to obtain a sintered material of a square bar shape of 70 mm×4 mm×2 mm.

Then, with respect to this square bar-shaped sintered material, a solidified material was prepared under the same conditions as in Example 2. This solidified material was further heated to 700° C. in an oxygen atmosphere, followed by gradual cooling at a rate of 15°

C./hr and then held at 450° C. for 40 hours to let it absorb oxygen sufficiently.

This oxide superconductor was observed by a scanning electron microscope and by an X-ray microanalyzer, whereby it was confirmed that as shown in FIG. 1, plate-like crystal grains of the 123 phase were overlaid one on another in a layered structure and granular crystal grains of the 211 phase were insularly dispersed therein. The crystal particle size of the 211 phase was at most as large as a few μm, and fine particles of less than 1 μm were observed to constitute at least 50% by volume. When a rare earth element having a large ion radius is used in combination with a rare earth element having a small ion radius, the precipitating 211 phase particle size tends to be small. For example, in a case of a system containing Y and Sm, the majority of the 211 phase crystals had particle size of not larger than 1 μm. Here, Sm is contained in a higher concentration in the 211 phase as compared with the 123 phase of the matrix.

With respect to the solidified materials thus obtained, superconducting characteristics were obtained in the same manner as in Example 3, and the results are shown in Table 2.

TABLE 2

| RE1 | a | RE2 | b | Tc (K) | Jc (A/cm$^2$) |
|---|---|---|---|---|---|
| Y | 7 | Sm | 6 | 93 | 5700 |
| Y | 7 | Eu | 6 | 90 | 5500 |
| Y | 10 | Ho | 3 | 92 | 3100 |
| Y | 11 | Er | 2 | 92 | 2800 |

TABLE 2-continued

| RE1 | a | RE2 | b | Tc (K) | Jc (A/cm$^2$) |
|---|---|---|---|---|---|
| Y | 3 | Yb | 10 | 91 | 2200 |
| Er | 10 | Sm | 3 | 90 | 6200 |
| Ho | 11 | Sm | 2 | 92 | 7100 |
| Ho | 7 | Dy | 6 | 90 | 2300 |
| Ho | 7 | Yb | 6 | 89 | 2600 |
| Dy | 10 | Yb | 3 | 91 | 2400 |

What is claimed is:

1. An oxide superconductor comprising a matrix of plate crystals of the formula $REBa_2Cu_3O_{7-y}$, oriented and overlaid one on another, and granular crystals of the formula $RE_2BaCuO_5$, insularly dispersed in said matrix in an amount of from 0.1 to 3 mol per mol of the $REBa_2Cu_3O_{7-y}$ crystals, wherein RE is at least two members selected from the group consisting of Y, La, Nd, Sm, Eu, Gd, Dy, Ho, Er, Tm, Yb, and Lu, said RE present in the second largest amount is at least 1 mol % of the total RE, y is the amount of oxygen deficiency, and the critical current density of said oxide superconductor is at least 2200 A/cm$^2$ at 77 K in an external magnetic field of 5 tesla.

2. The oxide superconductor of claim 1, wherein said RE present in the second largest amount is at least 10 mol % of the total RE.

3. The oxide superconductor according to claim 1, wherein the $RE_2BaCuO_5$ crystals are dispersed in an amount of from 0.2 to 3 mols per mol of the $REBa_2Cu_3O_{7-y}$ crystals.

4. The oxide superconductor according to claim 1, wherein at least 1% by volume of the $RE_2BaCuO_5$ granular crystals have a particle size of at most 1 μm.

* * * * *